(12) United States Patent
Thayer et al.

(10) Patent No.: US 7,129,731 B2
(45) Date of Patent: Oct. 31, 2006

(54) HEAT PIPE WITH CHILLED LIQUID CONDENSER SYSTEM FOR BURN-IN TESTING

(75) Inventors: John Gilbert Thayer, Lancaster, PA (US); Donald M. Ernst, Lancaster, PA (US)

(73) Assignee: Thermal Corp., Wilmington, DE (US)

( * ) Notice: Subject to any disclaimer, the term of this patent is extended or adjusted under 35 U.S.C. 154(b) by 273 days.

(21) Appl. No.: 10/929,869

(22) Filed: Aug. 30, 2004

(65) Prior Publication Data

US 2005/0068734 A1 Mar. 31, 2005

Related U.S. Application Data

(60) Provisional application No. 60/502,125, filed on Sep. 11, 2003, provisional application No. 60/499,483, filed on Sep. 2, 2003.

(51) Int. Cl.
*G01R 31/02* (2006.01)
*H05K 7/20* (2006.01)

(52) U.S. Cl. ........................ 324/760; 361/700; 361/701; 165/80.4

(58) Field of Classification Search ........ 361/699–703; 165/80.4, 104.33; 324/760
See application file for complete search history.

(56) References Cited

U.S. PATENT DOCUMENTS

| | | | |
|---|---|---|---|
| 2,137,044 A * | 11/1938 | Dawson ................. | 29/890.037 |
| 4,037,830 A | 7/1977 | Poluzzi et al. | |
| 4,213,698 A | 7/1980 | Firtion et al. | |
| RE31,053 E | 10/1982 | Firtion et al. | |
| 4,551,192 A | 11/1985 | Di Milia et al. | |
| 4,609,037 A | 9/1986 | Wheeler et al. | |
| 4,633,371 A * | 12/1986 | Nagy et al. ................. | 361/699 |
| 4,784,213 A | 11/1988 | Eager et al. | |
| 5,001,423 A | 3/1991 | Abrami et al. | |
| 5,084,671 A | 1/1992 | Miyata et al. | |
| 5,382,311 A | 1/1995 | Ishikawa et al. | |
| 5,383,971 A | 1/1995 | Selbrede | |
| 5,412,535 A * | 5/1995 | Chao et al. ................. | 361/700 |
| 5,413,167 A * | 5/1995 | Hara et al. ..................... | 165/86 |

(Continued)

FOREIGN PATENT DOCUMENTS

RU 1814606 A3 * 5/1993

*Primary Examiner*—Michael Datskovsky
*Assistant Examiner*—Robert J. Hoffberg
(74) *Attorney, Agent, or Firm*—Duane Morris LLP

(57) ABSTRACT

A burn-in testing cooling system includes a heat pipe having a tubular body. A capillary wick is disposed on an evaporator portion of the tubular body, and a base seals off the evaporator portion. The base is sized and shaped so as to be releasably thermally engaged with a semiconductor device during burn-in testing. A working fluid is disposed within the heat pipe in sufficient quantity to at least saturate the wick. A hollow tube is coiled around the exterior surface of the heat pipe such that a first set of interior coils are formed adjacent to the exterior surface. These interior coils are brazed to the exterior surface so as to enhance their thermal interface with the heat pipe. A second set of coils are wrapped around the first set of coils, in overlying relation to them. A source of coolant is arranged in flow communication with a second open end of the coiled tube, and a pump is arranged in flow communication with the source of coolant and a first open end of the coiled tube so as to circulate the coolant through the first set of interior coils and the second set of coils.

3 Claims, 5 Drawing Sheets

U.S. PATENT DOCUMENTS

| | | | |
|---|---|---|---|
| 5,435,379 A | 7/1995 | Moslehi et al. | |
| 5,458,687 A | 10/1995 | Shichida et al. | |
| 5,460,684 A | 10/1995 | Saeki et al. | |
| 5,474,877 A | 12/1995 | Suzuki | |
| 5,478,609 A | 12/1995 | Okamura | |
| 5,534,073 A | 7/1996 | Kinoshita et al. | |
| 5,582,242 A * | 12/1996 | Hamburgen et al. | 165/104.21 |
| 5,588,827 A | 12/1996 | Muka | |
| 5,610,529 A | 3/1997 | Schwindt | |
| 5,632,158 A * | 5/1997 | Tajima | 62/259.2 |
| 5,663,653 A | 9/1997 | Schwindt et al. | |
| 5,721,090 A | 2/1998 | Okamoto et al. | |
| 5,730,803 A | 3/1998 | Steger et al. | |
| 5,738,165 A | 4/1998 | Imai | |
| 5,762,714 A | 6/1998 | Mohn et al. | |
| 5,820,723 A | 10/1998 | Benjamin et al. | |
| 5,830,808 A | 11/1998 | Chapman | |
| 5,885,353 A | 3/1999 | Strodtbeck et al. | |
| 5,894,887 A * | 4/1999 | Kelsey et al. | 165/80.2 |
| 5,904,776 A | 5/1999 | Donde et al. | |
| 5,904,779 A | 5/1999 | Dhindsa et al. | |
| 5,944,093 A * | 8/1999 | Viswanath | 165/104.26 |
| 5,958,140 A | 9/1999 | Arami et al. | |
| 6,032,724 A | 3/2000 | Hatta | |
| 6,037,793 A | 3/2000 | Miyazawa et al. | |
| 6,073,681 A | 6/2000 | Getchel et al. | |
| 6,245,202 B1 | 6/2001 | Edamura et al. | |
| 6,313,649 B1 | 11/2001 | Harwood et al. | |
| 6,394,797 B1 | 5/2002 | Sugaya et al. | |
| 6,471,913 B1 | 10/2002 | Weaver et al. | |
| 6,583,638 B1 | 6/2003 | Costello et al. | |
| 6,700,641 B1 * | 3/2004 | Shiraishi | 355/30 |
| 6,725,909 B1 * | 4/2004 | Luo | 165/104.21 |
| 6,771,086 B1 | 8/2004 | Lutz et al. | |
| 6,793,009 B1 * | 9/2004 | Sarraf | 165/104.33 |
| 6,867,974 B1 * | 3/2005 | Luo | 361/700 |
| 6,938,680 B1 * | 9/2005 | Garner et al. | 165/104.26 |
| 2003/0066628 A1 * | 4/2003 | Mochizuki et al. | 165/104.26 |

* cited by examiner

HEAT PIPE WITH CHILLED LIQUID CONDENSER SYSTEM FOR BURN-IN TESTING

CROSS-REFERENCE TO RELATED APPLICATIONS

This application claims the benefit of U.S. Provisional Patent Application No. 60/499,483, filed Sep. 2, 2003 and U.S. Provisional Patent Application No. 60/502,125, filed Sep. 11, 2003.

FIELD OF THE INVENTION

The present invention generally relates to thermal management systems for semiconductor devices and, more particularly, to systems for cooling such semiconductor devices during burn-in testing.

BACKGROUND OF THE INVENTION

In the conventional manufacture of semiconductor devices, semiconductor wafers are first produced in batches. Each semiconductor wafer can contain many individual electronic devices or electronic circuits, which are known as dies. Each die is electrically tested by connecting it to special purpose test equipment. Probes, which are connected to the test equipment, are brought into contact with the die to be tested. This generally occurs at a prober station, which conventionally includes a platform arranged for supporting the wafer. It is important to test each individual circuit chip die while it is still attached in a wafer, and to also test the individual integrated circuit devices once they have been packaged for their intended use. In many testing applications, the tests must be performed at elevated temperatures which, if not regulated, could cause damage to the chip during testing. Accordingly, automated test systems are commonly outfitted with temperature control systems which can control the temperature of a semiconductor wafer or packaged integrated circuit under test.

For example, and referring to FIGS. 1 and 2, a semiconductor device test system A often includes a temperature-controlled semiconductor package support platform B that is mounted on a prober stage C of prober station D. A top surface E of the device support platform B supports a semiconductor device F and incorporates conventional vacuum line openings and grooves G facilitating secure holding of semiconductor device F in position on top surface E of device support platform B. A system controller and heater power source H are provided to control the temperature of device support platform B. A cooling system I is provided to help regulate the temperature of device support platform B. A user interface is provided in the form of a touch-screen display J where, for example, a desired temperature for the top of support platform B can be input. Temperature controlled systems for testing semiconductor devices during burn-in are well known, as disclosed in the following patents which are hereby incorporated herein by reference: U.S. Pat. Nos. 4,037,830, 4,213,698, RE31053, 4,551,192, 4,609,037, 4,784,213, 5,001,423, 5,084,671, 5,382,311, 5,383,971, 5,435,379, 5,458,687, 5,460,684, 5,474,877, 5,478,609, 5,534,073, 5,588,827, 5,610,529, 5,663,653, 5,721,090, 5,730,803, 5,738,165, 5,762,714, 5,820,723, 5,830,808, 5,885,353, 5,904,776, 5,904,779, 5,958,140, 6,032,724, 6,037,793, 6,073,681, 6,245,202, 6,313,649, 6,394,797, 6,471,913, 6,583,638, and 6,771,086.

In many cases such support platforms are required to be able to both heat and cool the device. Many types of temperature-controlled support platforms are known and are widely available. Cooling is very often provided by a heat sink that is cooled by a recirculating fluid, or in other designs by passing a fluid through the support platform without recirculating it. The fluid can be a liquid or a gas, usually air in the latter case. The liquid or air can be chilled for greater cooling effect in passing through the support platform, and can be recirculated for greater efficiency. A support platform cooled by means of a fluid chilled to a temperature below ambient temperature enables device probing at temperatures below ambient. In general, conventional heat-sink designs often incorporate simple cooling channels cross-drilled and capped in the support platform.

None of the foregoing systems and methods have been found to be completely satisfactory.

SUMMARY OF THE INVENTION

The present invention provides a cooling system for a semiconductor device burn-in test station comprising a heat pipe including a tubular body having an exterior surface and a central passageway. A capillary wick is disposed on at least an evaporator portion of the central passageway and a base seals off the evaporator portion of the central passageway. The base is sized and shaped so as to be releasably thermally engaged with a semiconductor device during burn-in testing. An elongate tube is coiled around the outer surface of the heat pipe so as to form a first set of coils that are often brazed to that outer surface. The open ends of the elongate tube are arranged in flow communication with a pressurized source of chilled coolant fluid so that the coolant circulates through the first set of coils and thereby removes heat from the heat pipe.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
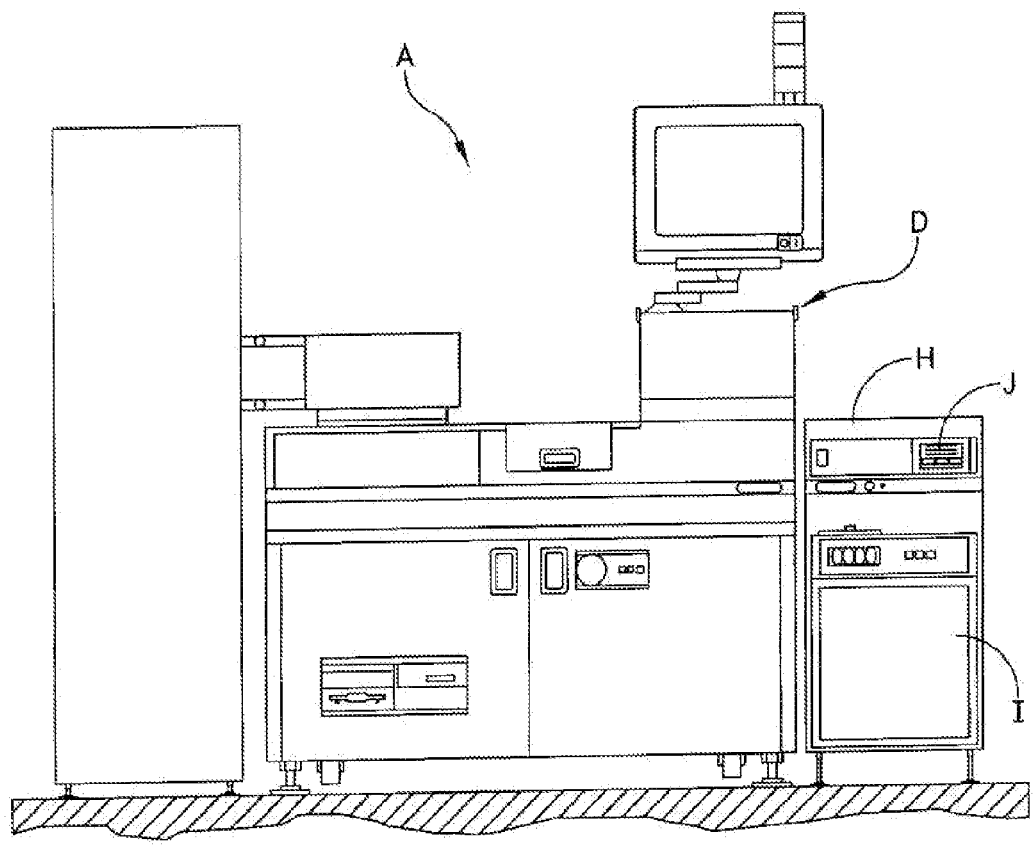
FIG. 1 is a front elevation view of a temperature-controlled semiconductor device testing system of the type contemplated for use with the present invention.
Figure 2:
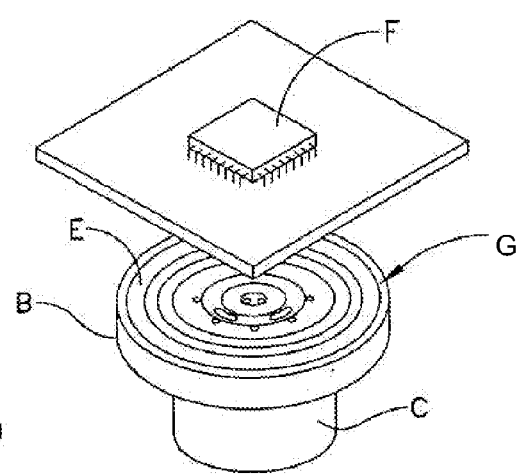
FIG. 2 is an exploded, perspective view of a support platform or chuck of the semiconductor device testing system shown in FIG. 1, and showing a typical semiconductor device.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 3:
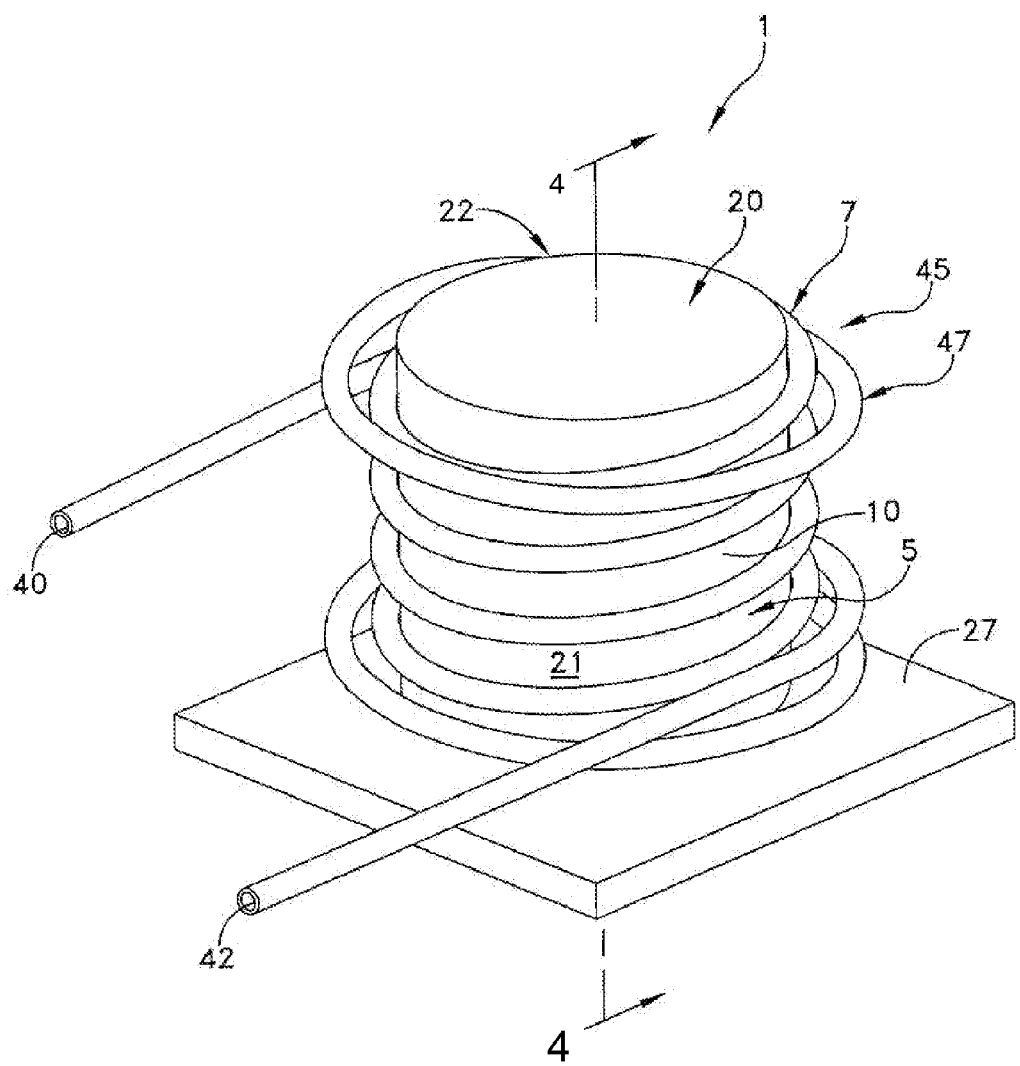
FIG. 3 is a perspective view of one embodiment of a heat pipe with chilled liquid condenser system formed in accordance with the present invention.
Figure 4:
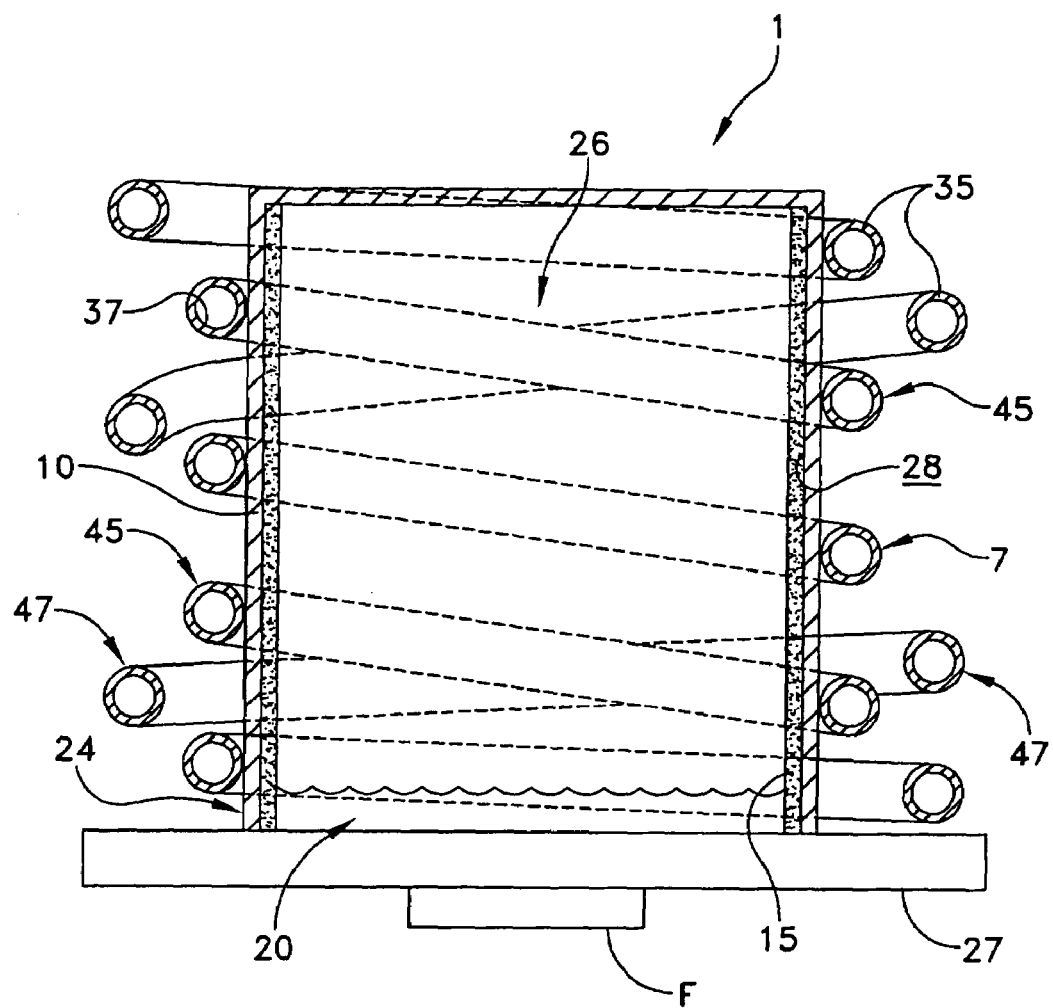
FIG. 4 is a cross-sectional view of the heat pipe with chilled liquid condenser system shown in FIG. 3.
Figure 5:
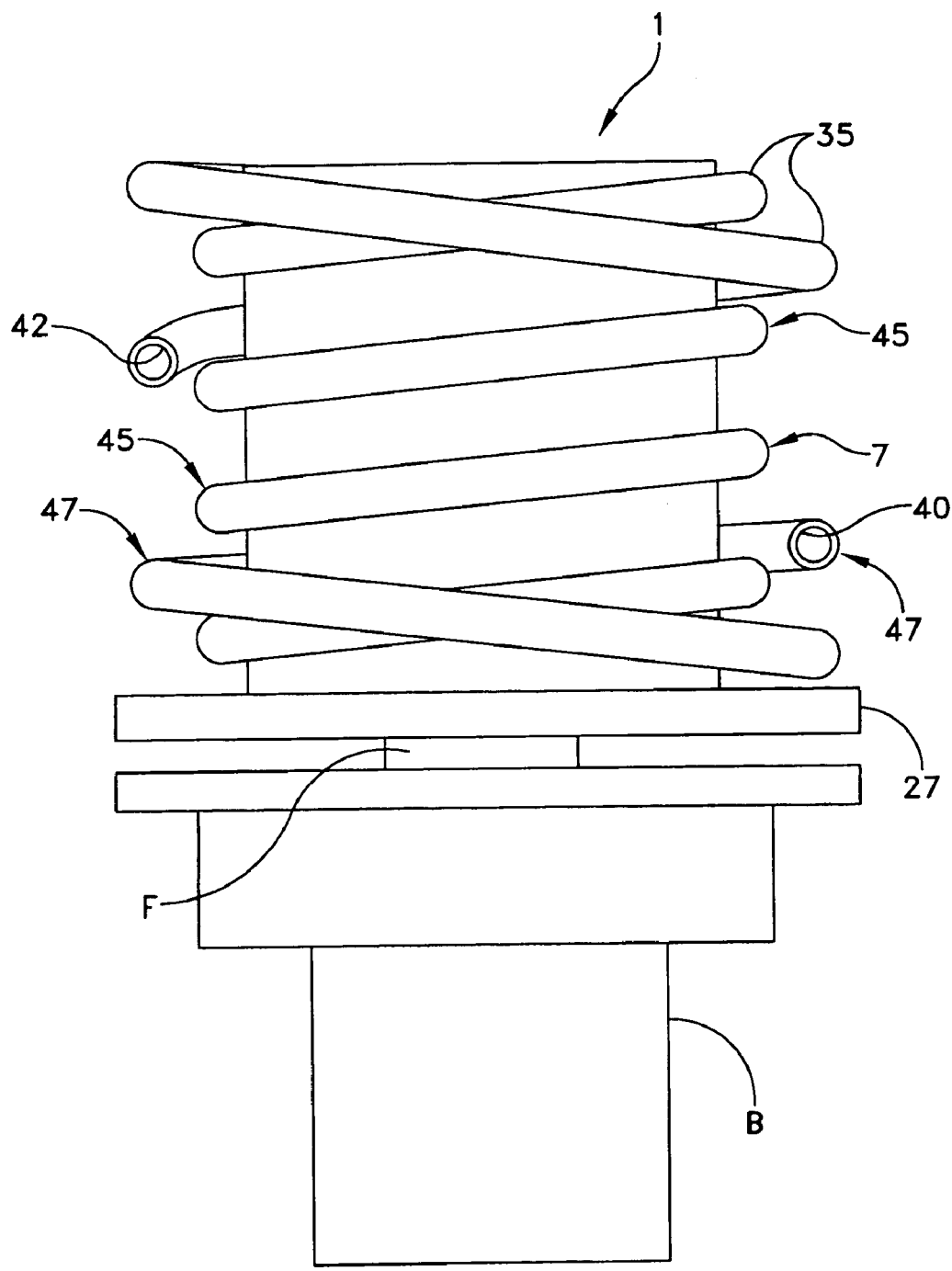
FIG. 5 is a side elevational view of a support platform of the semiconductor device testing system shown in FIG. 1, and showing a typical semiconductor device engaged with a heat pipe with chilled liquid condenser system formed in accordance with the present invention.
Figure 6:
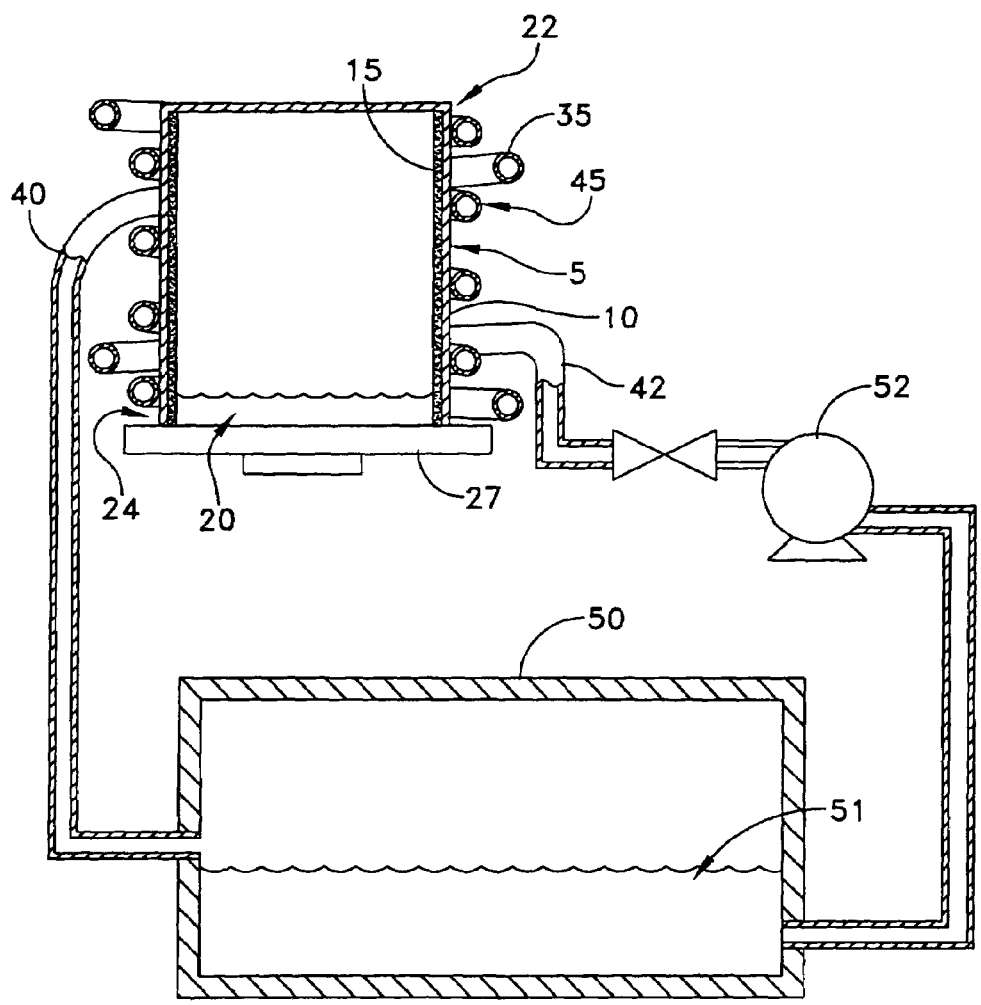
FIG. 6 is a schematic view of one possible arrangement of pump and pressurized coolant source for use with the present invention.

Referring to FIGS. 3–5, a heat pipe with chilled liquid condenser system 1 for use in cooling semiconductors devices F during burn-in testing includes a heat pipe 5 and a heat exchanger coil 7. More particularly, heat pipe 5 comprises of a vessel 10, a wick 15, and a working fluid 20. Vessel 10 includes an outer surface 21, a first end 22, a second end 24, and a central passageway 26 that is defined by the interior surface 28 of vessel 10. Vessel 10 also includes a thermal interface base 27 that is fixedly and hermetically attached to second end 24. A relatively long blind cylinder or tube that is formed from a thermally conductive material, e.g., copper or its alloys, monel, or the like, is often preferred for vessel 10. Of course, other shapes of vessel 10 may be used with equal effect. Central passageway 26 defines a vapor space within vessel 10. Vessel 10 is often about 10 mm in diameter and about 12 mm in height.

Wick 15 is disposed upon interior surface 28 of vessel 10, and may comprise adjacent layers of screening or a sintered powder structure with interstices between the particles of powder. In one embodiment, wick 15 may comprise sintered copper powder, sintered aluminum-silicon-carbide (AlSiC) or copper-silicon-carbide (CuSiC) having an average thickness of about 0.1 mm to 1.0 mm. The working fluid (not shown) may comprise any of the well known two-phase vaporizable liquids, e.g., water, alcohol, freon, etc.

Heat exchanger coil 7 comprises an elongate hollow tube 35 having a central passageway 37 of stainless steel, copper or its alloys, or the like highly thermally conductive material. Tube 35 includes a first conduit end 40 and a second conduit end 42 that are in fluid communication with one another through central passageway 37. Heat exchanger coil 7 is coiled around the outer surface 21 of vessel 10 such that a first set of interior coils 45 are formed adjacent to outer surface 21 (FIG. 3). Interior coils 45 are often brazed to outer surface 21 to increase their thermal contact with vessel 10. A second set of coils 47 are positioned in overlying relation to first set of interior coils 45. First conduit end 40 and second conduit end 42 are arranged in flow communication with a source 50 of chilled coolant 51 and a pump 52 so as to circulate coolant 51 through both first set of interior coils 45 and second set of coils 47 (FIG. 4).

In operation, base 27 of heat pipe 5 is exposed to one or more heat sources, e.g., semiconductor chip F, while at the same time first end 22 of heat pipe 5 is thermally engaged with heat exchanger coil 7, which is at a substantially lower temperature than semiconductor chip F. Heat is absorbed from semiconductor chip F by evaporation of liquid-phase working fluid 20 to vapor phase inside heat pipe 5 at second end 24. Working fluid 20 in vapor phase with its absorbed heat load is thermodynamically driven first end 22 of heat pipe 5 due to a pressure difference created between second end 24 and first end 22 by the heat generated by semiconductor chip F (FIG. 5).

The heat load created by operation of semiconductor chip F in test mode is rejected by working fluid 20 to vessel 10 adjacent to first end 22, with consequent condensation of working fluid 20 to liquid phase. Then, without leaving the same heat pipe chamber, condensed working fluid 20 is returned in liquid phase to second end 24 by capillary wick 15. As this two-phase heat exchange cycle occurs within heat pipe 5, conduit ends 40 and 42 of elongate tube 35 are arranged in flow communication with a pressurized source 50 of chilled coolant fluid 51. As a result, chilled coolant circulates through first set of coils 45 and thereby removes heat from first end 22 of heat pipe 5.

It is to be understood that the present invention is by no means limited only to the particular constructions herein disclosed and shown in the drawings, but also comprises any modifications or equivalents within the scope of the claims.

What is claimed is:

1. A cooling system for a semiconductor device burn-in test station comprising, in combination:
    a heat pipe comprising a tubular body having an exterior surface, a central passageway, and a wick disposed on at least an evaporator portion of said central passageway;
    a working fluid saturating said wick;
    a base sealing off said evaporator portion of said central passageway;
    a flexible tube coiled around said exterior surface of said heat pipe such that a first set of interior coils are formed adjacent to said exterior surface wherein said interior coils are brazed to said exterior surface, and a second set of coils are positioned in overlying relation to said first set of interior coils; and
    a pressurized source of chilled coolant arranged in flow communication with said flexible tube so that chilled coolant is circulated through said flexible tube.

2. A cooling system for a semiconductor device burn-in test station comprising, in combination:
    a heat pipe comprising a tubular body having an exterior surface and a central passageway, a wick disposed on at least an evaporator portion of said central passageway, a working fluid saturating said wick, and a base sealing off said evaporator portion of said central passageway;
    a tube having a first open end and a second open end that is wrapped around said exterior surface of said heat pipe such that a first set of interior coils are formed adjacent to said exterior surface wherein said interior coils are brazed to said exterior surface, and a second set of coils are positioned in overlying relation to said first set of interior coils;

a source of coolant arranged in flow communication with said second open end of said coiled tube; and a pump arranged in flow communication with said source of coolant and said first open end of said coiled tube so as to circulate said coolant through said first set of interior coils and said second set of coils.

3. A semiconductor device burn-in test station comprising, in combination:

a heat pipe comprising a tubular body having an exterior surface and a central passageway, a wick disposed on at least an evaporator portion of said central passageway, a working fluid saturating said wick, and a base sealing off said evaporator portion of said central passageway;

a tube having a first open end and a second open end that is wrapped around said exterior surface of said heat pipe such that a first set of interior coils are formed adjacent to said exterior surface wherein said interior coils are brazed to said exterior surface, and a second set of coils are positioned in overlying relation to said first set of interior coils;

a source of coolant arranged in flow communication with said second open end of said coiled tube;

a pump arranged in flow communication with said source of coolant and said first open end of said coiled tube so as to circulate said coolant through said first set of interior coils and said second set of coils; and a semiconductor device arranged in thermal engagement with said base.

* * * * *